United States Patent
Nolas et al.

(10) Patent No.: US 7,534,414 B2
(45) Date of Patent: May 19, 2009

(54) CLATHRATE COMPOUNDS AND METHOD OF MANUFACTURING

(75) Inventors: George S. Nolas, Tampa, FL (US); Sarath Witanachchi, Tampa, FL (US); Pritish Mukherjee, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 12/104,016

(22) Filed: Apr. 16, 2008

(65) Prior Publication Data

US 2008/0226836 A1    Sep. 18, 2008

Related U.S. Application Data

(63) Continuation of application No. PCT/US2006/041086, filed on Oct. 20, 2006.

(60) Provisional application No. 60/728,508, filed on Oct. 20, 2005.

(51) Int. Cl.
*C01B 13/14*    (2006.01)

(52) U.S. Cl. .................................... 423/592.1; 502/401

(58) Field of Classification Search .............. 423/592.1; 502/401, 439
See application file for complete search history.

(56) References Cited

U.S. PATENT DOCUMENTS

| 6,103,403 | A  | 8/2000  | Grigorian et al. |
| 6,188,011 | B1 | 2/2001  | Nolas et al.     |
| 6,423,286 | B1 | 7/2002  | Gryko            |
| 6,461,581 | B1 | 10/2002 | Eguchi et al.    |
| 6,797,199 | B2 | 9/2004  | Eguchi et al.    |

*Primary Examiner*—Edward M Johnson
(74) *Attorney, Agent, or Firm*—Molly L. Sauter; Smith & Hopen, P.A.

(57) ABSTRACT

The present invention comprises new materials, material structures, and processes of fabrication of such that may be used in technologies involving the conversion of light to electricity and/or heat to electricity, and in optoelectronics technologies. The present invention provide for the fabrication of a clathrate compound comprising a type II clathrate lattice with atoms of silicon and germanium as a main framework forming lattice spacings within the framework, wherein the clathrate lattice follows the general formula $Si_{136-y}Ge_y$, where y indicates the number of Ge atoms present in the main framework and 136-y indicates the number of Si atoms present in the main framework, and wherein y>0.

31 Claims, 3 Drawing Sheets

CLATHRATE COMPOUNDS AND METHOD OF MANUFACTURING

CROSS REFERENCE TO RELATED APPLICATIONS

This application is a continuation of prior filed International Application, Ser. No. PCT/US2006/041086 filed Oct. 20, 2006, which claims priority to U.S. provisional patent application No. 60/728,508 filed Oct. 20, 2005 which is hereby incorporated by reference into this disclosure.

STATEMENT OF GOVERNMENT INTEREST

This invention was made with Government support under Grant No. DE-FG02-04ER46146 awarded by the United States Department of Energy. The Government has certain rights in the invention.

BACKGROUND OF THE INVENTION

The direct conversion of solar energy to electricity is a technology which holds great promise for contributing to the solution of future global energy needs. However, currently, the technology has neither reached the efficiency nor reduction in cost necessary to contribute significantly as a source of energy on a large scale. The most effective route to realization of large scale solar energy conversion is to find vastly improved materials from which the necessary devices may be fabricated. Typically, these materials may either (a) convert light to electricity with greatly improved efficiency or (b) greatly reduce the cost of device fabrication, or both.

Although solar energy holds great promise as a source of power for the future, major advances in materials development must be made. While some advances in solar cell efficiencies have been made in the last few decades, new materials that offer superior efficiencies could offer the boost needed to make photovoltaics a global widespread source of energy. Also, the high costs of producing solar cells are a significant barrier to the widespread use of photovoltaic energy conversion.

The direct conversion of heat to electricity through thermoelectric power generation also holds great promise for lightening the burdens of increasing energy needs. However, the materials utilized by this technology are the limiting factor in achieving higher efficiencies. A material's usefulness as a thermoelectric is measured by its dimensionless figure of merit ZT. Current state of the art thermoelectric materials possess ZT between 1 and 1.5. Though many advances have been made in recent years, the current values of ZT are still too low for use in large-scale power generation and/or refrigeration.

Thus, a need exists in the art for new materials for use in the direct conversion of solar and heat energy to electricity.

SUMMARY OF INVENTION

As many technologies are limited by the materials they utilize, and as improvements upon existing materials are often not enough to provide significant advancements in the technologies, new materials, structures, and/or approaches must be found.

The present invention addresses the need for higher efficiency materials for energy conversion applications, specifically for photovoltaic and thermoelectric energy conversion applications. The present invention also addresses the need for optoelectronic materials that may be easily integrated into current electronics technologies. The present invention offers new directions in addressing these problems, in as much as structural aspects of these new materials may be adjusted offering control over the materials properties, which are specifically useful for photovoltaic, optoelectronic, and/or thermoelectric applications.

The present invention comprises specific materials composed of the type II clathrate crystal structure, consisting of a lattice framework composed of nano-scale polyhedra that form cavities that may encapsulate guest atoms, as well as methods of controlling the structural aspects of these materials, and methods of producing these materials in bulk and thin film form, for use in photovoltaic (PV), thermoelectric (TE), and/or optoelectronic applications. The structures and the optical and electrical properties of these materials may be manipulated in a controlled fashion in order to optimize the materials properties for the desired application.

Specifically, frameworks composed of Si, Ge, or Si—Ge alloys are within the scope of the present invention. The atoms of the main framework may be substituted by other atoms, as described below, in order to optimize the electrical, thermal, mechanical, and structural properties in these materials. Also, the guest atoms may be made to selectively occupy the different cavities in varying concentrations, again in order to optimize the electrical, thermal, mechanical, and structural properties in these materials.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

In addition to intense basic scientific investigation, currently clathrate materials are attracting attention for their potential use in numerous technological applications, including thermoelectrics, superconductivity, optoelectronics, photovoltaics, hard and low compressibility materials, magnetic materials, and energy storage. It is the unique structural aspects of these materials, and how these aspects relate to their physical properties, that raise such wide interest. Most of the work on inorganic clathrates to date has been focused on what is known as the type I structure.

Figure 1:
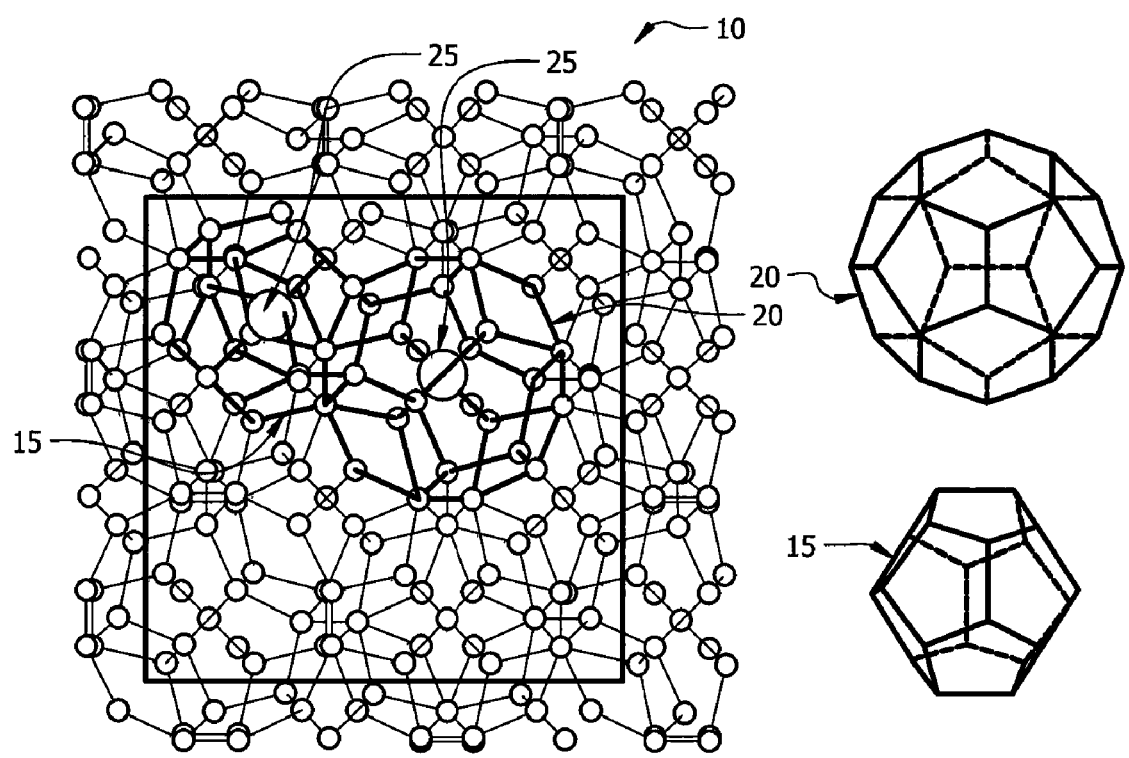
FIG. 1($a$) is an illustration of the crystal structure of the type II clathrate, indicating the guest atoms inside the two polyhedra. 1($b$) is a representation of the polyhedra, $E_{28}$ (top) and $E_{20}$ (bottom), that form the framework in type II clathrates.

The present invention comprises materials that form with what is known as the type II clathrate crystal structure, and includes controlled manipulation of the structure and/or composition, methods of producing the materials in bulk and thin film form, and use of these materials in photovoltaic applications. With reference to FIG. 1a, these materials are composed of a covalently bonded framework, which forms "polyhedra" that can encapsulate guest atoms inside. The invention pertains to type II clathrate materials that have the general form $A_xE_{136}$ (0<x<24), in which E represents the atoms forming the framework of the structure, and A represents the guest atoms contained inside the framework polyhedra. As illustrated with reference to FIG. 1b, there are two distinct polyhedra that form the building blocks of the structure, denoted $E_{20}$ (twenty vertices at which the E atoms reside; sixteen $E_{20}$ cages per conventional unit cell of $E_{136}$) 15 and $E_{28}$ (twenty-eight vertices at which the E atoms reside; eight $E_{28}$ per $E_{136}$) 20, and their size and the local environment of the guest atom inside is distinctly different. In accordance with the present invention guest atoms 25, may or may not reside within lattice spacings formed by the polyhedra of the clathrate lattice.

The crystal structure of the type II clathrate consists of structural units $A_xE_{136}$ in which E represents the atoms forming the framework of the structure, and A represents the guest atoms contained inside the framework polyhedra. In the present invention, E can include, but is not limited to Si, Ge, or Sn, and A includes, but is not limited to Na, K, Rb, Cs, Ca, Sr, Ba, or Eu. The present invention allows the control of the various structural aspects of the type II clathrate structure, in order to control and/or optimize the material's physical properties for photovoltaic applications. The manipulation of the band gap, carrier (or doping) concentration and photo-electric efficiency are described in the following paragraphs. These methods can be used individually; however they are intended to be used in any combination to optimize the desired physical properties of the compound. Clathrate materials are currently generating interest for several applications, as noted above, however the combination of the methods explained below comprises a new way to optimize the necessary properties for the appropriate application. The methods of producing the materials are also described below.

The present invention allows for the formation of alloys in the main framework of the structure. Specifically, Si—Ge alloys of the general type $A_xSi_{136-y}Ge_y$, are formed in accordance with the present invention. For the conversion of light to electricity, these alloys show superior performance over either pristine Si or Ge type II clathrate frameworks, in as much as the Si—Ge alloy type II clathrates possess a direct band gap in the electronic band structure, in the visible light range, whereas the pristine clathrates possess indirect band gaps. Direct gap semiconductors allow more efficient absorption of light. The fact that these are Si based materials allows for the integration into current Si based photovoltaic and optoelectronic technologies. The formation of alloys also has beneficial effects on the thermoelectric properties of these materials, in as much as the thermal conductivity is reduced by mass fluctuation scattering of phonons, due to the difference in mass between Si and Ge.

Figure 2:
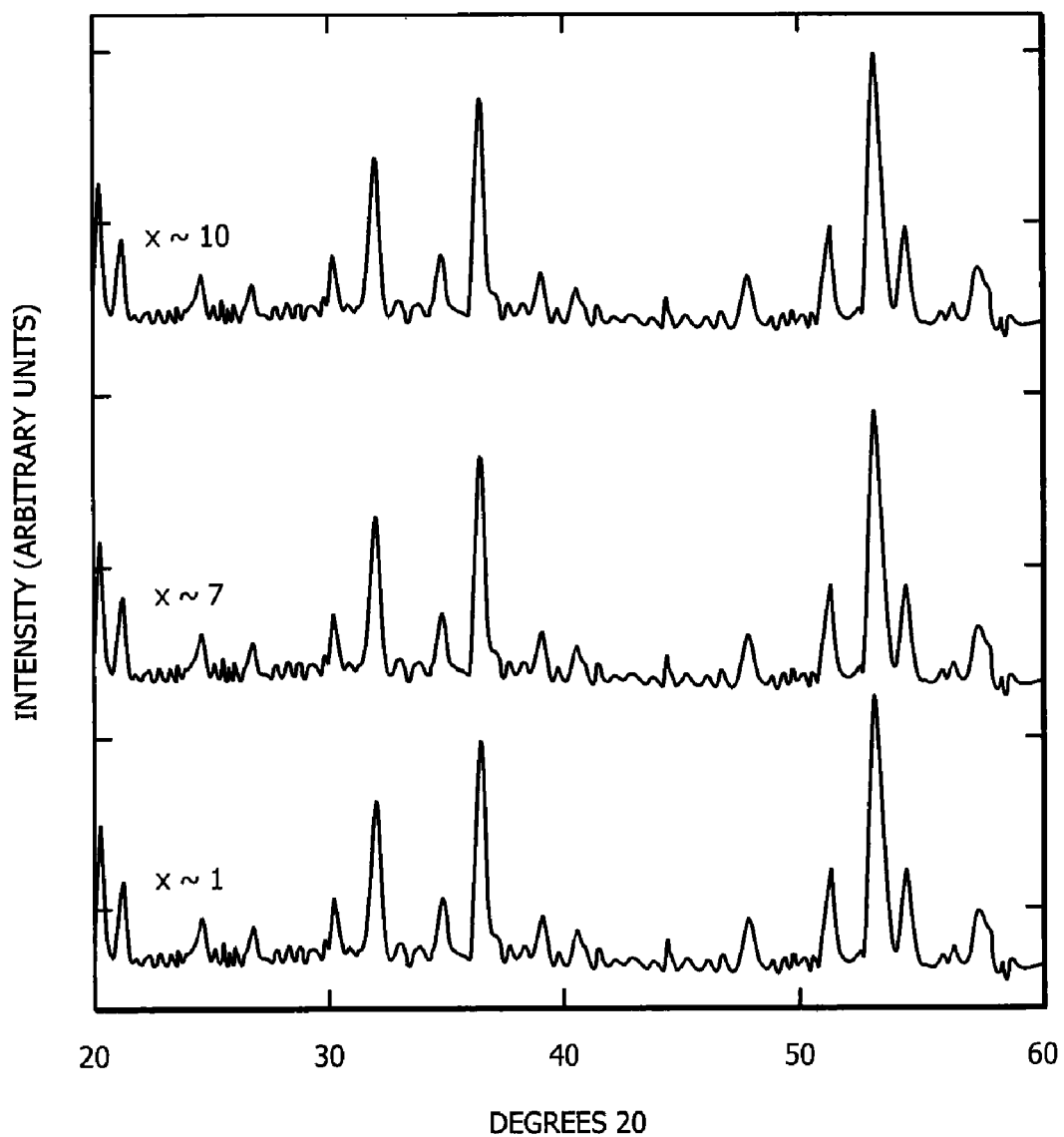
FIG. 2 is a graph illustrating the powder x-ray diffraction patterns of $Na_xSi_{136}$ for three values of x showing the high purity of these type II Si clathrates and the ability to vary x.
Figure 3:
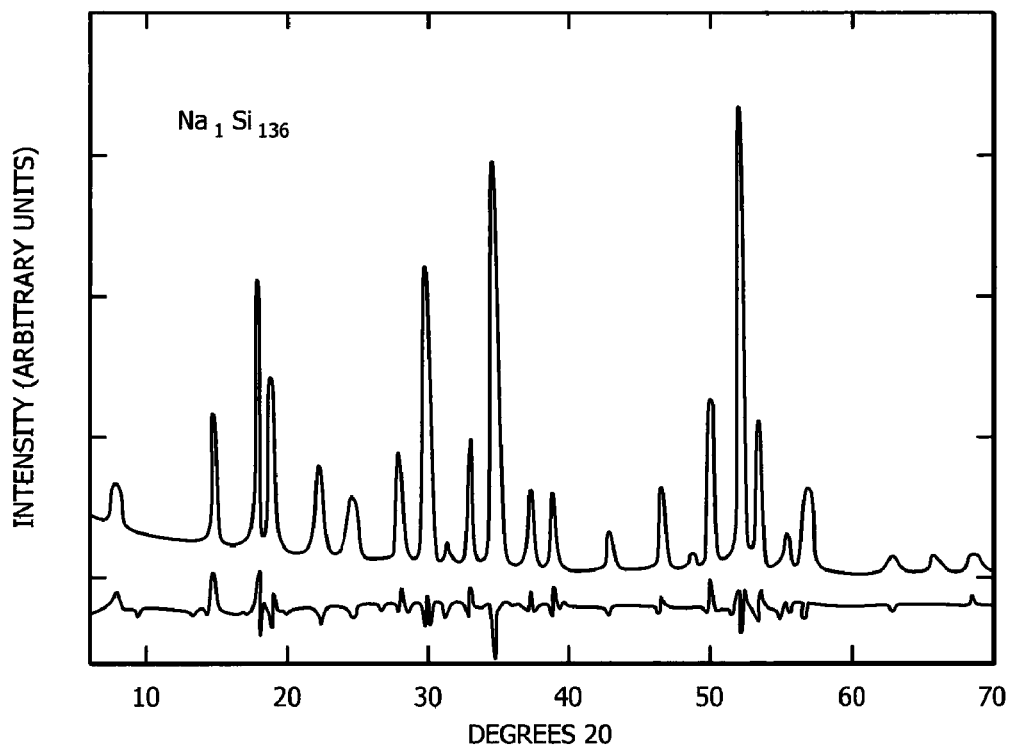
FIG. 3 is a graph illustrating the refinement of powder X-ray diffraction data for $Na_1Si_{136}$.
Figure 4:
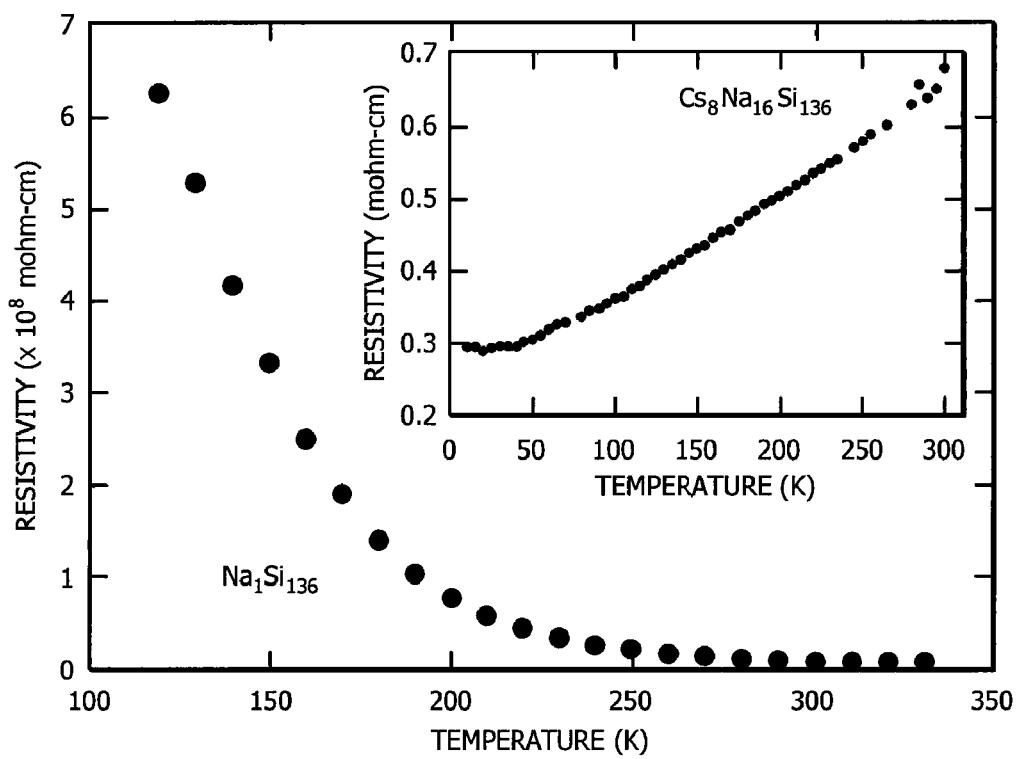
FIG. 4 is a graphical illustration of the electrical resistivity of $Na_1Si_{136}$ (low alkali content) and the fully occupied $Cs_8Na_{16}Si_{136}$ (high alkali content, inset) showing the wide variation of the electrical properties of type II clathrates determined by the guest atom content. $Na_1Si_{136}$ behaves as an electrical insulator whereas $Cs_8Na_{16}Si_{136}$ possesses metallic behavior.

The present invention allows for the guest atom concentration in the type II clathrates to be varied, by adjustment of the synthesis processing. Thus in the general formula $A_xE_{136}$ the value of x may be varied from 0<x<24. As illustrated with reference to FIG. 2, FIG. 3 and FIG. 4, the electrical properties of type II clathrates depend sensitively on the value of x, where for low x the materials are insulating or semiconducting, and for high x the materials show metallic properties. This allows for tuning the carrier concentration and the band gap in order to optimize these materials for photovoltaic application. This approach, combined with formation of solid solutions allows for a more complete tunability towards optimization for photovoltaic applications.

In addition to varying the total guest atom content x, in the present invention the guest atoms are made to selectively occupy the two distinct polyhedra $E_{20}$ and $E_{28}$. For example, for fixed x, say x=8, the guests may be distributed among the polyhedra, possible configurations include: all sixteen guests in the $E_{20}$ cages, with none in the $E_{28}$ cages; all eight guests in the $E_{28}$ cages with none in the $E_{20}$ cages; or four guests in the $E_{20}$ cages and four guests in the $E_{28}$ cages. As the two polyhedra that the guests may occupy comprise distinct crystallographic sites, with different local environments, the selective occupation of the sites allows for adjustment of the structure of the materials, and also allows for the control of the physical properties of these materials. This allows for the control of the effective charge transfer from the guest atoms to the cages, offering a route for adjusting the electrical properties. Also, the thermal properties are affected by the concentration of the guest atoms.

The present invention allows for the substitution of the framework E atoms by other atoms, resulting in a chemical formula of $A_xE_{136-y}M_y$, where the substitutional atom M includes, but is not limited to Ni, Pd, Pt, Cu, Ag, Au, Zn, Al, Ga, In, P, As, and Sb, and E is Si, Ge, or Sn. The substitution of framework atoms also allows for the controlled adjustment of the electrical and thermal properties. In particular, framework substitution may be used to form semiconducting materials and to have accurate control over the electrical transport properties in these materials.

The present invention allows for the production of type II clathrate materials in bulk or film form for various electronic and/or thermoelectric applications. The methods utilized in the invention allow for bulk quantities of high purity type II clathrates to be produced as described below.

In a first embodiment, intermediate Zintl compounds are used. Some examples include, but are not limited to NaSi, NaGe, NaSn, KSi, KGe, KSn, RbSi, RbGe, RbSn, CsSi, CsGe, CsSn, $BaSi_2$, $BaGe_2$, $BaSn_2$, $SrSi_2$, $SrGe_2$, $SrSn_2$, $Na_{1-x}K_xSi_2$, $Na_{1-x}K_xGe_2$, $Na_{1-x}K_xSn_2$, $Na_{1-x}Rb_xSi_2$, $Na_{1-x}Rb_xGe_2$, $Na_{1-x}Rb_xSn_2$, $Na_{1-x}Cs_xSi_2$, $Na_{1-x}Cs_xGe_2$, $Na_{1-x}Cs_xSn_2$, $K_{1-x}Rb_xSi_2$, $K_{1-x}Rb_xGe_2$, $K_{1-x}Rb_xSn_2$, $K_{1-x}Cs_xSi_2$, $K_{1-x}Cs_xGe_2$, $K_{1-x}Cs_xSn_2$, $Rb_{1-x}Cs_xSi_2$, $Rb_{1-x}Cs_xGe_2$, $Rb_{1-x}Cs_xSn_2$, $NaSi_{1-y}Ge_y$, $KSi_{1-y}Ge_y$, $RbSi_{1-y}Ge_y$, $CsSi_{1-y}Ge_y$, $Na_{1-x}K_xSi_{1-y}Ge_y$, $Na_{1-x}Rb_xSi_{1-y}Ge_y$, $Na_{1-x}Cs_xSi_{1-y}Ge_y$, $K_{1-x}Rb_xSi_{1-y}Ge_y$, $K_{1-x}Cs_xSi_{1-y}Ge_y$, and $Rb_{1-x}Cs_xSi_{1-y}Ge_y$ (0<x, y<1), or any variation, combination, mixture, alloy, or solid solution of any of these compounds. It is important to note that other intermediate compounds not listed may also be used. The intermediate Zintl compounds are formed by reaction of the appropriate high purity elements in the proper mole ratios at 650° C. in tungsten crucibles, sealed in a steel canister under high purity nitrogen gas at a pressure of one atmosphere. The steel canister is itself sealed under nitrogen at a pressure slightly less than atmosphere in a quartz tube. The resulting intermediate Zintl compounds are extremely sensitive to air and moisture and all handling must be performed in an inert atmosphere. To form the type II clathrate, the appropriate intermediate Zintl compound is ground to a very fine powder, placed in a quartz crucible, which is then inserted into a quartz tube that is sealed at one end. The tube is then attached to a vacuum valve coupling allowing for connection to a high vacuum system, keeping the sample under nitrogen atmosphere. The gas is then evacuated from the tube, and the intermediate Zintl compound is heated to approximately 275° C. for several hours to remove any excess alkali metal that may be present. The intermediate Zintl compound is then slowly heated from this temperature to an appropriate temperature for the synthesis of the type II clathrate, the temperature depending on the composition to be achieved. For example, in the case of NaSi a typical temperature is 420° C. to form the clathrate $Na_xSi_{136}$. The guest atom content is controlled by the amount of time the material is heated in the furnace. For example, a $Na_xSi_{136}$ material heated for eight hours at 420° C. results in x=8, while a $Na_xSi_{136}$ material heated for twenty-four hours at 420° C. results in x=1.

In a second embodiment, stoichiometric amounts of high purity elements are combined in a tungsten or tantalum crucible sealed in a steel canister under nitrogen gas at a pressure of one atmosphere. The steel canister is itself sealed under nitrogen in a quartz tube. The mixture is reacted at 800° C. for 48 hours, then cooled to 650° C. and held at this temperature for seven days. The compound is then cooled to room temperature. This produces high purity type II clathrates with general compositions of $A_{24}E_{136-y}M_y$, $A_8B_{16}E_{136-y}M_y$, $A_8B_{16}Si_{136-y}Ge_y$, and $A_8B_{16}Si_{136-y-z}Ge_yM_z$, where A and B include, but are not limited to Na, K, Cs, Rb, Ca, Ba, Sr, Eu, M includes, but is not limited to Ni, Pd, Pt, Cu, Ag, Au, Zn, Al, Ga, In, P, As, and Sb, and E is Si, Ge, or Sn.

In a third embodiment, the guest atom content in type II clathrates of general composition $A_{24}E_{136-y}M_y$, $A_8B_{16}E_{136-y}M_y$, $A_8B_{16}Si_{136-y}Ge_y$, and $A_8B_{16}Si_{136-y-z}Ge_yM_z$ is varied, resulting in the general compositions $A_xE_{136-y}M_y$, $A_xB_mE_{136-y}M_y$, $A_xSi_{136-y}Ge_y$, $A_xB_mSi_{136-y}Ge_y$, and $A_xB_mSi_{136-y-z}Ge_yM_z$. Type II clathrates of the composition $A_{24}E_{136-y}M_y$, $A_8B_{16}E_{136-y}M_y$, $A_8B_{16}Si_{136-y}Ge_y$, and $A_8B_{16}Si_{136-y-z}Ge_yM_z$ are first synthesized using the method outlined in the previous paragraph. These are referred to as "fully occupied" or "stoichiometic," in as much as all of the polyhedra are occupied by guest atoms. These compounds are then ground to fine powders and annealed at temperatures between 300° C. and 500° C. under high vacuum of $10^{-5}$ to $10^{-6}$ torr. The process of grinding and annealing is repeated as necessary, and the temperature is increased each time as necessary. This vacuum annealing or "degassing" removes a portion of the guest atoms from the polyhedra, leaving these polyhedra unoccupied. Thus, the products of this procedure are type II clathrates of general composition $A_xE_{136-y}M_y$, $A_xB_mE_{136-y}M_y$, $A_xSi_{136-y}Ge_y$, $A_xB_mSi_{136-y}Ge_y$ and $A_xB_mSi_{136-y-z}Ge_yM_z$.

The invention allows for the production of type II clathrates in thin and thick film form for photovoltaic and optoelectronic applications. Most of the growth methods used in film and coating technology known in the art can be used to fabricate type II clathrate films. Specifically, the method of single or dual laser ablation, offers the ability to maintain precise control over the composition or stoichiometry of these films. Various methods for the formation of type II clathrate films in accordance with the present invention by laser ablation are within the scope of the present invention, including, but not limited to:

Ablate a compact bulk target of NaSi→NaSi film→Type II clathrate film

Ablate a compact bulk target of NaSi in a Na vapor environment→Type II clathrate film Ablate a compact bulk target of $Na_xSi_{136-y}Ge_y$→Type II clathrate film Ablate compact bulk targets of other alkali compounds in similar manner, e.g. NaGe, CsGe, KSi, etc.

The film can then be deposited on any substrate at a deposition temperature of between 0° C. to 900° C.

In a particular embodiment, the film growth process in accordance with the present invention includes the steps of, placing the material target to be ablated on a rotational stage in a vacuum system ($\sim 10^{-6}$ Torr) and focusing a pulsed laser beam (preferably a uv laser) onto the target through an optical window on the vacuum system. The laser-target interaction produces a plasma plume that expands away from the target. A substrate (silicon, glass, etc.) is then placed 4-10 cm in front of the target to collect the evaporated material in the form of a film. The substrate can be heated in the temperature range of 20-900° C. to promote crystallization and film adhesion to the substrate.

If incorporation of additional Na into the growing film is needed, Na may be thermally evaporated in a boat to generate a high Na vapor pressure in the vicinity of the substrate.

In another embodiment utilizing dual-laser ablation, a second laser of suitable wavelength (most likely an infrared laser) is spatially overlapped with the first laser on the target with a suitable delay between the laser pulses of the two lasers (~50 ns) to minimize particulate ejection and to maximize the material plume energy.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A clathrate compound comprising a type II clathrate lattice with atoms of silicon and germanium as a main framework forming lattice spacings within the framework, wherein the clathrate lattice follows the general formula $Si_{136-y}Ge_y$, where y indicates the number of Ge atoms present in the main framework and 136-y indicates the number of Si atoms present in the main framework, and wherein y>0.

2. The clathrate compound of claim 1, further comprising guest atoms (A) to selectively occupy the lattice spacings of the clathrate lattice, such that the clathrate lattice follows the general formula $A_xSi_{136-y}Ge_y$, where 0<x<24.

3. The clathrate compound of claim 2, wherein the guest atoms (A) are atoms of at least one element selected from the group consisting of Li, Na, K, Rb, Cs, Fr, Be, Mg, Ca, Sr, Ba, Ra, Sc, Y, La, Ce, Pr, Nd, Sm, Eu, Gd, Tb, Dy, Ho, Er, Tm, Yb, Lu, Ac, Th, Pa, U, Cu, Ag, Au, Zn, Cd, Hg, B, Al, Ga, In, Tl, Ti, Zr, Hf, Nb, Ta, Cr, Mo, W, Fe, Co, Ni, Ru, Rh, Pd, Os, Ir, and Pt.

4. The clathrate compound of claim 2, further comprising guest atoms (B) to selectively occupy the lattice spacings of the clathrate lattice, such that the clathrate lattice follows the general formula $A_xB_mSi_{136-y}Ge_y$, where 0<x<24, 0<m≦24, and x+m≦24.

5. The clathrate compound of claim 4, wherein the guest atoms (B) are atoms of at least one element selected from the group consisting of Li, Na, K, Rb, Cs, Fr, Be, Mg, Ca, Sr, Ba, Ra, Sc, Y, La, Ce, Pr, Nd, Sm, Eu, Gd, Tb, Dy, Ho, Er, Tm, Yb, Lu, Ac, Th, Pa, U, Cu, Ag, Au, Zn, Cd, Hg, B, Al, Ga, In, Tl, Ti, Zr, Hf, Nb, Ta, Cr, Mo, W, Fe, Co, Ni, Ru, Rh, Pd, Os, Ir, and Pt.

6. The clathrate compound of claim 1, further comprising substitution atoms (M) which are substituted for at least one portion of atoms which make up the clathrate lattice, such that the clathrate lattice follow the general formula $Si_{136-y-z}Ge_yM_z$, where y indicates the number of Ge atoms present in the main framework, z indicates the number of substitution atoms (M) in the framework and 136-y-z indicates the number of Si atoms present in the main framework, and wherein y>0 and z>0.

7. The clathrate compound of claim 6, wherein the substitution atoms (M) are atoms of at least one element selected from the group consisting of Cu, Ag, Au, Zn, Cd, Hg, B, Al, Ga, In, Tl, Ti, Zr, Hf, Nb, Ta, Cr, Mo, W, Fe, Co, Ni, Ru, Rh, Pd, Os, Ir, Pt.

8. The clathrate compound of claim 1, wherein the clathrate lattice further comprises sixteen $E_{20}$ polyhedra and eight $E_{28}$ polyhedra per unit cell of $E_{136}$, wherein the $E_{20}$ polyhedra have twenty vertices at which the E atoms reside, and the $E_{28}$ polyhedra have twenty-eight vertices at which the E atoms reside.

9. The clathrate compound of claim 8, further comprising guest atoms (A) to selectively occupy the lattice spacings of the clathrate lattice, wherein the guest atoms are made to selectively occupy the two distinct polyhedra $E_{20}$ and $E_{28}$.

10. The clathrate compound of claim 9, further comprising eight guest atoms (A), and wherein the guest atoms (A) are made to occupy eight of the lattice spacings within the $E_{28}$ polyhedra.

11. The clathrate compound of claim 9, further comprising sixteen guest atoms (A), and wherein the guest atoms (A) are made to occupy sixteen of the lattice spacings within the $E_{20}$ polyhedra.

12. The clathrate compound of claim 9, further comprising eight guest atoms (A), and wherein the guest atoms (A) are made to occupy four of the lattice spacings within the $E_{20}$ polyhedra and four of the lattice spacings within the $E_{28}$ polyhedra.

13. A thermoelectric device having at least one thermoelectric element formed in part from a clathrate compound comprising a type II clathrate lattice with atoms of silicon and germanium as a main framework forming lattice spacings within the framework, wherein the clathrate lattice follows the general formula $Si_{136-y}Ge_y$, where y indicates the number of Ge atoms present in the main framework and 136-y indicates the number of Si atoms present in the main framework, and wherein y>0.

14. A photovoltaic device having at least one part formed in part from a clathrate compound comprising a type II clathrate lattice with atoms of silicon and germanium as a main framework forming lattice spacings within the framework, wherein the clathrate lattice follows the general formula $Si_{136-y}Ge_y$, where y indicates the number of Ge atoms present in the main framework and 136-y indicates the number of Si atoms present in the main framework, and wherein y>0.

15. An optoelectronic device having at least one optoelectronic element formed in part from a clathrate compound comprising a type II clathrate lattice with atoms of silicon and germanium as a main framework forming lattice spacings within the framework, wherein the clathrate lattice follows the general formula $Si_{136-y}Ge_y$, where y indicates the number of Ge atoms present in the main framework and 136-y indicates the number of Si atoms present in the main framework, and wherein y>0.

16. A method of synthesizing the clathrate compound of claim 1, the method comprising the steps of:
   a) forming an intermediate Zintl compound in a nitrogen gas atmosphere;
   b) grinding the intermediate Zintl compound to a fine powder in an inert atmosphere;
   c) heating the ground intermediate Zintl compound to a first temperature of approximately 275° C. for a predetermined first duration of time to remove any excess alkali metal that may be present in the compound; and
   d) heating the intermediate Zintl compound to a second temperature for a predetermined second duration of time to form the clathrate compound, wherein the second temperature determines the composition of the clathrate compound and the second duration of time determines a guest atom content within the lattice spacings of the clathrate compound.

17. The method of claim 16, wherein the intermediate Zintl compounds are selected from the group consisting of NaSi, NaGe, NaSn, KSi, KGe, KSn, RbSi, RbGe, RbSn, CsSi, CsGe, CsSn, $BaSi_2$, $BaGe_2$, $BaSn_2$, $SrSi_2$, $SrGe_2$, $SrSn_2$, $Na_{1-x}K_xSi_2$, $Na_{1-x}K_xGe_2$, $Na_{1-x}K_xSn_2$, $Na_{1-x}Rb_xSi_2$, $Na_{1-x}Rb_xGe_2$, $Na_{1-x}Rb_xSn_2$, $Na_{1-x}Cs_xSi_2$, $Na_{1-x}Cs_xGe_2$, $Na_{1-x}Cs_xSn_2$, $K_{1-x}Rb_xSi_2$, $K_{1-x}Rb_xGe_2$, $K_{1-x}Rb_xSn_2$, $K_{1-x}Cs_xSi_2$, $K_{1-x}Cs_xGe_2$, $K_{1-x}Cs_xSn_2$, $Rb_{1-x}Cs_xSi_2$, $Rb_{1-x}Cs_xGe_2$, $Rb_{1-x}Cs_xSn_2$, $NaSi_{1-y}Ge_y$, $KSi_{1-y}Ge_y$, $RbSi_{1-y}Ge_y$, $CsSi_{1-y}Ge_y$, $Na_{1-x}K_xSi_{1-y}Ge_y$, $Na_{1-x}Rb_xSi_{1-y}Ge_y$, $Na_{1-x}Cs_xSi_{1-y}Ge_y$, $K_{1-x}Rb_xSi_{1-y}Ge_y$, $K_{1-x}Cs_xSi_{1-y}Ge_y$, and $Rb_{1-x}Cs_xSi_{1-y}Ge_y$ (0<x, y<1), or any variation, combination, mixture, alloy, or solid solution of any of these compounds.

18. The method of claim 16, wherein the intermediate Zintl compounds are formed by a reaction of appropriate high purity elements in the proper mole ratios for a predetermined time in a crucible, sealed in a steel canister under high purity nitrogen gas at a predetermined pressure.

19. The method of claim 16, wherein the intermediate Zintl compound is NaSi, the second temperature is about 420° C. and the predetermined second duration of time is about eight hours, resulting in a clathrate compound of the form $Na_8Si_{136}$.

20. The method of claim 16, wherein the intermediate Zintl compound is NaSi, the second temperature is about 420° C. and the predetermined second duration of time is about twenty-four hours, resulting in a clathrate compound of the form $Na_1Si_{136}$.

21. A method of synthesizing the clathrate compound of claim 1 having all of the lattice spacings occupied by a guest atom, the method comprising the steps of:
   combining stoichiometric amounts of high purity elements in a sealed canister under nitrogen gas at a pressure of about one atmosphere;
   sealing the sealed canister under nitrogen gas in a quartz tube;
   reacting the combined elements at about 800° C. for about forth-eight hours;
   cooling the combined elements to about 650° C. and holding at 650° C. for about seven days; and
   cooling the combined elements to room temperature, thereby producing clathrate compounds with general compositions of $A_{24}E_{136-y}M_y$, $A_8B_{16}E_{136-y}M_y$, $A_8B_{16}Si_{136-y}Ge_y$, and $A_8B_{16}Si_{136-y-z}Ge_yM_z$.

22. The method of claim 21, wherein A is selected from the group consisting of Na, K, Cs, Rb, Ca, Ba, Sr, Eu, La, Ce, Pr, Nd, Sm, Gd, Tb, Dy, Ho, Er, Ym, Yb, Lu.

23. The method of claim 21, wherein B is selected from the group consisting of Na, K, Cs, Rb, Ca, Ba, Sr, Eu, La, Ce, Pr, Nd, Sm, Gd, Tb, Dy, Ho, Er, Ym, Yb, Lu.

24. The method of claim 21, wherein M is selected from the group consisting of Ni, Pd, Pt, Cu, Ag, Au, Zn, Al, Ga, In, P, As, Cd, Hg, B, Tl, Ti, Xr, Hf, Fe, Co, Ru, Rh, Ir.

25. The method of claim 21, further comprising, after step (d), the steps of:
   e) grinding the compound to a fine powder;
   f) annealing the ground compound at temperature between about 300° C. and about 500° C. under a high vacuum of about $10^{-5}$ torr to $10^{-6}$ torr; and g) repeating steps (e) and (f), while increasing the temperature of step (f) each time the step is repeated, to remove a portion of the guest atoms from the polyhedra, thereby leaving unoccupied polyhedra having the general composition $A_xE_{136-y}M_y$, $A_xB_mE_{136-y}M_y$, $A_xSi_{136-y}Ge_y$, $A_xB_mSi_{136-y}Ge_y$ and $A_xB_mSi_{136-y-z}Ge_yM_z$.

26. A method of fabricating a thin or thick film of the clathrate compound of claim 1 on a substrate, wherein a Si or Si containing compound of predetermined composition, in solid or vapor form, and Ge or Ge containing compound of predetermined composition, in solid or vapor form, are evaporated in a vacuum or inert atmosphere in the presence of the substrate to form the film on the substrate.

27. A method of fabricating a thin or thick film of the clathrate compound of claim 1 on a substrate, wherein a bulk target of type II clathrate composition of claim 1 is evaporated in a vacuum or inert atmosphere in the presence of the substrate to form the film on the substrate.

28. A method of fabricating a thin or thick film of the clathrate compound of claim 2 on a substrate, wherein a bulk target of type II clathrate composition of claim 2 is evaporated in a vacuum or inert atmosphere in the presence of the substrate to form the film on the substrate.

29. method of fabricating a thin or thick film of the clathrate compound of claim 1 on a substrate, wherein a bulk target containing Si within a predetermined composition and a bulk target containing Ge within a predetermined composition are laser ablated in the presence of a predetermined substrate to form the film on the substrate.

30. The method of claim 27, wherein the bulk target of type II clathrate composition of claim 1 is evaporated utilizing laser ablation techniques.

31. The method of claim 28, wherein the bulk target containing type II clathrate composition of claim 2 is evaporated utilizing laser ablation techniques.

* * * * *